(12) United States Patent
Basilico et al.

(10) Patent No.: US 10,804,859 B2
(45) Date of Patent: Oct. 13, 2020

(54) TRANSIMPEDANCE AMPLIFIERS WITH FEEDFORWARD CURRENT

(71) Applicant: ANALOG DEVICES, INC., Norwood, MA (US)

(72) Inventors: Simon Nicholas Fiedler Basilico, San Francisco, CA (US); Yoshinori Kusuda, San Jose, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 16/214,414

(22) Filed: Dec. 10, 2018

(65) Prior Publication Data

US 2020/0186098 A1 Jun. 11, 2020

(51) Int. Cl.
| H03F 1/00 | (2006.01) |
| H03F 1/08 | (2006.01) |
| H03F 3/45 | (2006.01) |
| H03F 3/68 | (2006.01) |

(52) U.S. Cl.
CPC ......... *H03F 1/086* (2013.01); *H03F 3/45179* (2013.01); *H03F 3/68* (2013.01); *H03F 2200/129* (2013.01); *H03F 2200/144* (2013.01); *H03F 2200/153* (2013.01); *H03F 2200/228* (2013.01); *H03F 2200/331* (2013.01); *H03F 2200/462* (2013.01); *H03F 2200/471* (2013.01); *H03F 2203/45116* (2013.01);
(Continued)

(58) Field of Classification Search
CPC . H03F 3/08; H03F 3/082; H03F 3/085; H03F 3/087

USPC .............................. 330/308, 151; 250/214 A
See application file for complete search history.

(56) References Cited

U.S. PATENT DOCUMENTS

| 4,540,952 A | 9/1985 | Williams |
| 5,602,511 A | 2/1997 | Woolaway |
| 5,708,392 A | 1/1998 | Gross |

(Continued)

FOREIGN PATENT DOCUMENTS

| CN | 1287408 A | 3/2001 |
| CN | 104113293 A | 10/2014 |

(Continued)

OTHER PUBLICATIONS

Kromer, Christian, "A Low-Power 20-Ghz 52-dBΩ Transimpedance Amplifier in 80-23 CMOS," IEEE Journal of Solid-State Circuits, vol. 39, No. 6, Jun. 2004, pp. 885-894.
(Continued)

*Primary Examiner* — Steven J Mottola
(74) *Attorney, Agent, or Firm* — Knobbe, Martens, Olson & Bear, LLP (57) ABSTRACT

Transimpedance amplifiers with feedforward current are provided herein. In certain embodiments, an amplifier system includes a transimpedance amplifier that amplifies an input current received at an input to generate an output voltage at an output. The amplifier system further includes a controllable current source that is coupled to the output of the transimpedance amplifier, and operable to provide a feedforward current that changes in relation to the input current of the transimpedance amplifier. By providing a feedforward current in this manner, gain and speed performance of the transimpedance amplifier is enhanced.

20 Claims, 8 Drawing Sheets

(52) U.S. Cl.
CPC .............. *H03F 2203/45514* (2013.01); *H03F 2203/45524* (2013.01); *H03F 2203/45526* (2013.01)

(56) References Cited

U.S. PATENT DOCUMENTS

| | | |
|---|---|---|
| 5,982,232 A | 11/1999 | Rogers |
| 6,297,701 B1 | 10/2001 | Visocchi et al. |
| 6,593,810 B2 | 7/2003 | Yoon |
| 6,812,795 B2 | 11/2004 | Prianishnikov et al. |
| 7,265,631 B2 | 9/2007 | Kwa et al. |
| 7,288,754 B2 | 10/2007 | Tsai |
| 7,403,065 B1 | 7/2008 | Gresham et al. |
| 7,449,958 B1 | 11/2008 | Voo |
| 7,605,660 B1 | 10/2009 | Kobayashi |
| 8,674,770 B2 | 3/2014 | Takiba et al. |
| 9,136,807 B2 | 9/2015 | Wurcer |
| 9,503,198 B2 | 11/2016 | Noda |
| 10,079,584 B1 | 9/2018 | Jing et al. |
| 2004/0196105 A1* | 10/2004 | Filip .................. H03F 3/08 330/308 |
| 2005/0195038 A1 | 9/2005 | Neenan et al. |
| 2007/0109056 A1 | 5/2007 | Kwa et al. |
| 2007/0228257 A1 | 10/2007 | Soltesz et al. |
| 2010/0289584 A1 | 11/2010 | Aroca et al. |
| 2016/0118970 A1 | 4/2016 | Kim et al. |
| 2018/0219519 A1 | 8/2018 | Schober et al. |

FOREIGN PATENT DOCUMENTS

| | | |
|---|---|---|
| CN | 105406823 A | 3/2016 |
| CN | 205377794 U | 7/2016 |
| EP | 0 664 604 A2 | 12/1994 |
| JP | 2007-159020 A | 6/2007 |

OTHER PUBLICATIONS

Pearson, Jonathan, "Compensating Current Feedback Amplifiers in Photocurrent Applications," Analog Dialogue 47-02, Jul. 2013, 4 pgs.

Royo, Guillermo et al., "Programmable Low-Power Low-Noise Capacitance to Voltage Converter for MEMS Accelerometers," Sensors 2017, 17, 67, 10 pages.

* cited by examiner

TRANSIMPEDANCE AMPLIFIERS WITH FEEDFORWARD CURRENT

FIELD OF THE DISCLOSURE

Embodiments of the invention relate to electronic systems, and more particularly, to amplifiers.

BACKGROUND

Certain electronic devices employ amplifiers for processing signals. When operating open loop, such amplifiers receive an input signal and generate an output signal having a gain in comparison to the input signal. Various operational parameters of an amplifier can impact the overall performance of the electronic system using the amplifier. For example, the amplifier's bandwidth can be important to reliably amplify transient signals such as pulses and/or to maintain amplifier stability when connected using negative feedback. In another example, an amplifier's noise performance can be important, such as in applications in which a relatively small or weak signal is amplified.

SUMMARY OF THE DISCLOSURE

Transimpedance amplifiers with feedforward current are provided herein. In certain embodiments, an amplifier system includes a transimpedance amplifier that amplifies an input current received at an input to generate an output voltage at an output. The amplifier system further includes a controllable current source that is coupled to the output of the transimpedance amplifier, and operable to provide a feedforward current that changes in relation to the input current of the transimpedance amplifier. By providing a feedforward current in this manner, gain and speed performance of the transimpedance amplifier is enhanced.

In one aspect, an amplifier system with feedforward current is provided. The amplifier system includes a current input terminal, a voltage output terminal, a transimpedance amplifier configured to generate an output voltage at the voltage output terminal based on amplifying an input current received from the current input terminal, and a controllable current source electrically connected to the voltage output terminal. The controllable current source is operable to output a feedforward current that changes in relation to the input current.

In another aspect, a method of electronic amplification is provided. The method includes receiving an input current at a current input of a transimpedance amplifier, amplifying the input current to generate an output voltage using the transimpedance amplifier, and providing the output voltage at a voltage output of the transimpedance amplifier. The method further includes providing a feedforward current to the voltage output of the transimpedance amplifier, the feedforward current changing in relation to the input current.

In another aspect, an amplifier system is provided. The amplifier system includes a current input terminal configured to receive an input current, a voltage output terminal configured to provide an output voltage, and a transimpedance amplifier including a current input configured to receive the input current and a voltage output configured to provide the output voltage. The amplifier system further includes means for injecting a feedforward current at the voltage output of the transimpedance amplifier, the feedforward current changing in relation to the input current.

DETAILED DESCRIPTION OF EMBODIMENTS

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Transimpedance amplifiers with feedforward current are provided herein. In certain embodiments, an amplifier system includes a transimpedance amplifier that amplifies an input current received at an input to generate an output voltage at an output. The amplifier system further includes a controllable current source that is coupled to the output of the transimpedance amplifier, and operable to provide a feedforward current that changes in relation to the input current of the transimpedance amplifier.

Implementing the amplifier system in this manner enhances gain and speed performance. For example, by injecting a replica or copy of the transimpedance amplifier's input current at the transimpedance amplifier's output, the design constraints of the transimpedance amplifier are relaxed. For example, the transimpedance amplifier can operate with relaxed output drive characteristics.

In contrast, a transimpedance amplifier that operates without a feedforward current can have added design complexity for providing a large output current drive. For example, the output transistors of such a transimpedance amplifier can operate with large bias currents and/or very large aspect ratios to accommodate a maximum output current condition. However, implementing a transimpedance amplifier in this manner leads to undesirable performance trade-offs between a variety of parameters, such as power dissipation, speed, output swing, and/or linearity. Moreover, large output transistors can have large parasitic capacitances (for instance, large gate or base capacitances) that negatively impact frequency performance and/or stability.

By injecting a feedforward current at the output of a transimpedance amplifier, the transimpedance amplifier operates with enhanced gain and speed performance. Moreover, the transimpedance amplifier's output transistors can provide a relatively small mismatch current rather than the full output current for the maximum output current condition, and thus can be downsized to achieve further performance enhancement.

The amplifier systems herein can be used in a wide range of applications, including, but not limited to, data converters, instrumentation amplifiers, and/or impedance measurement circuitry. For example, an amplifier system can be used to measure the current and/or voltage of a sensor or other device under test (DUT), thereby detecting various changes in environmental quantities or conditions. In certain implementations, the amplifier system also biases the DUT and/or measures a DUT's bias voltage to aid in enhancing measurement accuracy and/or in protecting the DUT from damage from overvoltage or other improper biasing.

Figure 1:
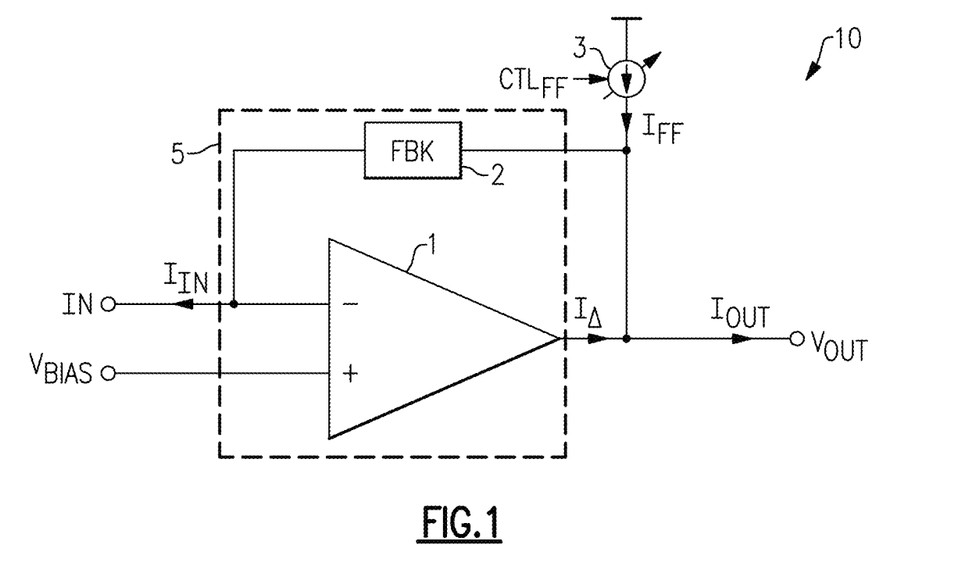
FIG. 1 is a schematic diagram of an amplifier system according to one embodiment.

FIG. 1 is a schematic diagram of an amplifier system 10 according to one embodiment. The amplifier system 10 includes a feedforward current source 3 and a transimpedance amplifier 5. The amplifier system 10 further includes a current input terminal (IN), a bias voltage terminal ($V_{BIAS}$), and a voltage output terminal ($V_{OUT}$).

Although one embodiment of a transimpedance amplifier operating with feedforward current is shown, the teachings herein are applicable to amplifier systems implemented in a wide variety of ways. Accordingly, other implementations are possible.

In the illustrated embodiment, the transimpedance amplifier 5 includes an amplification circuit 1 and a feedback circuit 2. As shown in FIG. 1, the feedback circuit 2 is electrically connected between an output and an inverting input of the amplification circuit 1 to provide feedback. The amplification circuit 1 further includes a non-inverting input that receives a reference voltage for amplification from the bias voltage terminal. In certain implementations, the feedback circuit 2 provides at least one of resistive feedback or capacitive feedback.

The transimpedance amplifier 5 operates as a current to voltage converter. For example, the transimpedance amplifier 5 controls a voltage of the voltage output terminal ($V_{OUT}$) based on amplifying an input current ($I_{IN}$) received from the current input terminal (IN). For example, when the feedback circuit 2 is implemented as a resistor, the output voltage provided to the voltage output terminal can have a linear relationship with respect to the input current.

The amplification circuit 1 can be implemented in a wide variety of ways. In certain implementations, the amplification circuit 1 is implemented using an operational amplifier or other high voltage gain circuit. For example, the amplification circuit 1 can generate an output voltage based on amplifying a voltage difference between the amplification circuit's non-inverting and inverting inputs. By connecting such an amplification circuit with negative feedback, current to voltage conversion can be provided. For example, the feedback circuit 2 controls the closed-loop gain between the output voltage of the transimpedance amplifier 5 and the input current to the transimpedance amplifier 5.

As shown in FIG. 1, the feedforward current source 3 is electrically connected to the output of the transimpedance amplifier 1, and generates a feedforward current ($I_{FF}$). The feedforward current changes in relation to the input current ($I_{IN}$). Thus, the amplitude of the feedforward current varies with respect to the amplitude of the input current. Implementing the amplifier system 10 in this manner improves gain, enhances speed, and/or relaxes the output load driving constraints of the transimpedance amplifier 5.

In certain implementations, the feedforward current ($I_{FF}$) is substantially equal to the input current ($I_{IN}$). However, the feedforward current can have other values while still achieving benefits in gain and speed. For instance, in another example, $I_{FF}=\alpha*I_{IN}$, where a is a scaling factor between about 0.5 and about 1.

As shown in FIG. 1, a control signal ($CTL_{FF}$) controls the feedforward current source 3 to output the feedforward current ($I_{FF}$) to track the input current ($I_{IN}$). In certain implementations, the value of the control signal changes such that the feedforward current is a replica or copy of the input current. The control signal can be generated in a wide variety of ways, including, but not limited to, using a current mirror that mirrors the input current, using analog control loops, and/or using digital processing to control the current source.

Including the feedforward current source 3 can provide a number of advantages, including, but not limited to, higher gain, faster speed, and/or relaxed output drive characteristics. For example, to control the voltage of the voltage output terminal ($V_{OUT}$), the amplifier system 10 can sink or source an output current ($I_{OUT}$) to adjust the output voltage level to a particular value. By including the feedforward current source 3, the amplification circuit 1 need only output a small mismatch current ($I_\Delta$), which in certain implementations is about equal to $I_{IN}-I_{FF}$.

In contrast, a transimpedance amplifier that operates without a feedforward current must accommodate a large output current drive, which adds to design complexity. For example, the output transistors of such a transimpedance amplifier can operate with large bias current and/or have a very large aspect ratio, which leads to undesirable performance trade-offs and/or degraded stability.

Figure 2A:
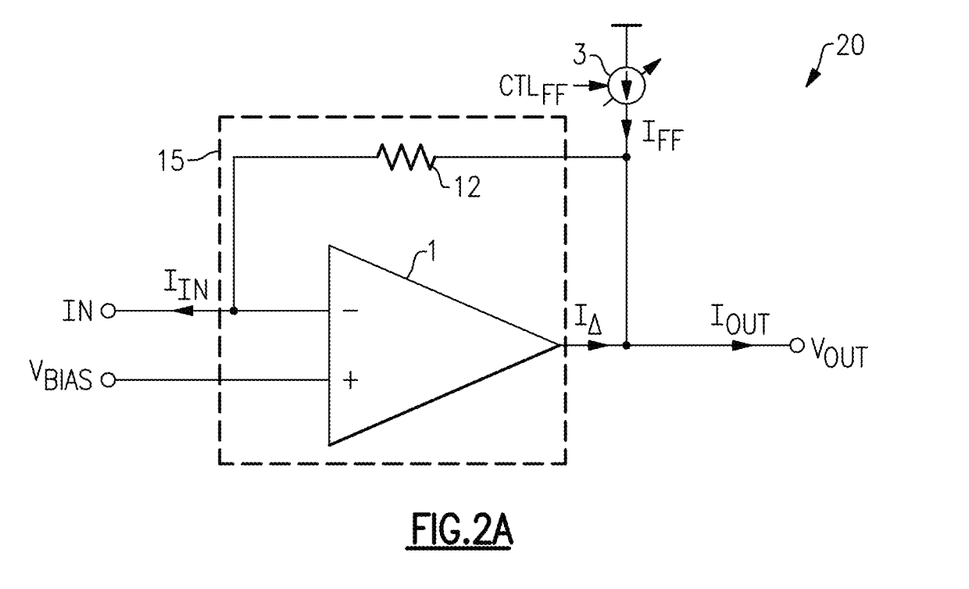
FIG. 2A is a schematic diagram of an amplifier system according to another embodiment.

FIG. 2A is a schematic diagram of an amplifier system 20 according to another embodiment. The amplifier system 20 includes a feedforward current source 3 and a transimpedance amplifier 15. The amplifier system 20 further includes a current input terminal (IN), a bias voltage terminal ($V_{BIAS}$), and a voltage output terminal ($V_{OUT}$).

The amplifier system 20 of FIG. 2A is similar to the amplifier system 10 of FIG. 1, except that the amplifier system 20 includes a specific implementation of feedback circuitry. For example, the transimpedance amplifier 15 of FIG. 2A includes a feedback resistor 12 that is connected between the output and inverting input of the amplification circuit 1 to provide feedback.

In certain implementations, the resistance of the resistor 12 is controllable (for instance, digitally programmable and/or tunable with analog control) to aid in controlling the gain characteristics of the transimpedance amplifier 15.

Although one embodiment of feedback circuitry for a transimpedance amplifier is shown, the teachings herein are applicable to feedback circuitry implemented in a wide variety of ways.

Figure 2B:
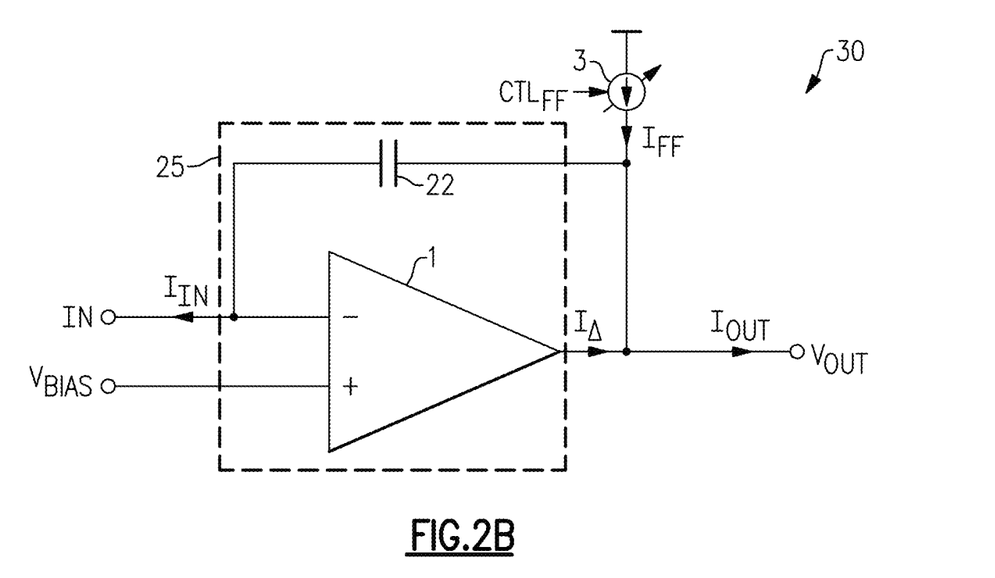
FIG. 2B is a schematic diagram of an amplifier system according to another embodiment.

FIG. 2B is a schematic diagram of an amplifier system 30 according to another embodiment. The amplifier system 30 includes a feedforward current source 3 and a transimpedance amplifier 25. The amplifier system 30 further includes a current input terminal (IN), a bias voltage terminal ($V_{BIAS}$), and a voltage output terminal ($V_{OUT}$).

The amplifier system 30 of FIG. 2B is similar to the amplifier system 10 of FIG. 1, except that the amplifier system 30 includes a specific implementation of feedback circuitry. For example, the transimpedance amplifier 25 of FIG. 2B includes a feedback capacitor 22 that is connected between the output and inverting input of the amplification circuit 1 to provide feedback.

In certain implementations, the capacitance of the capacitor 22 is controllable (for instance, digitally programmable and/or tunable with analog control) to aid in controlling the gain characteristics of the transimpedance amplifier 25. Although not depicted in FIG. 2B, in certain implementations, the transimpedance amplifier 25 further includes one or more reset switches for selectively resetting a voltage across the feedback capacitor 22, thereby controlling the capacitor's stored charge.

Figure 2C:
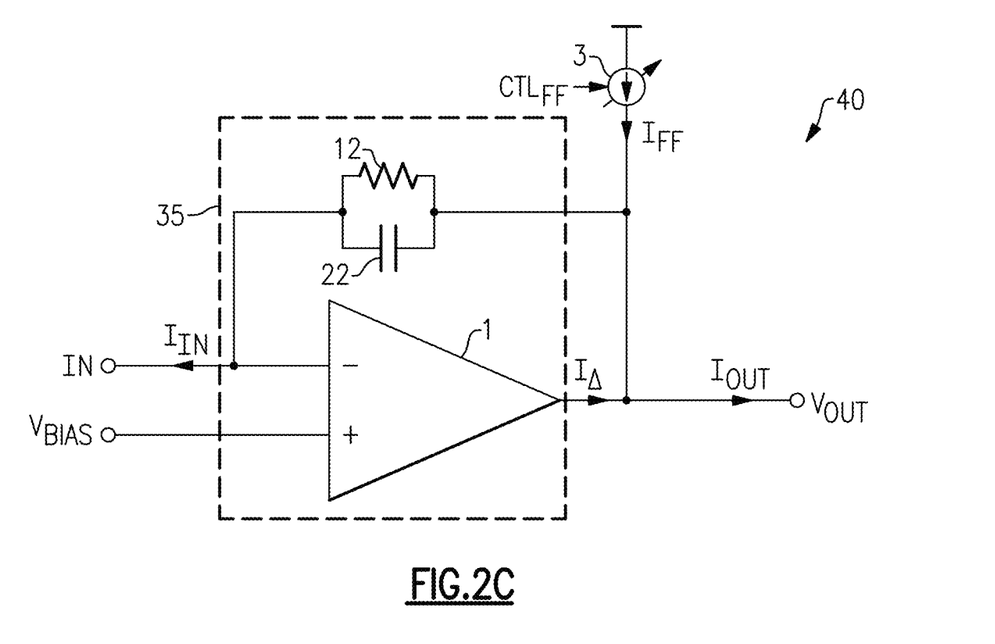
FIG. 2C is a schematic diagram of an amplifier system according to another embodiment.

FIG. 2C is a schematic diagram of an amplifier system 40 according to another embodiment. The amplifier system 40 includes a feedforward current source 3 and a transimpedance amplifier 35. The amplifier system 40 further includes a current input terminal (IN), a bias voltage terminal ($V_{BIAS}$), and a voltage output terminal ($V_{OUT}$).

The amplifier system 40 of FIG. 2C is similar to the amplifier system 10 of FIG. 1, except that the amplifier system 40 includes a specific implementation of feedback circuitry. For example, the transimpedance amplifier 35 of FIG. 2C includes a feedback resistor 12 and a feedback capacitor 22 that are electrically connected in parallel between the output and inverting input of the amplification circuit 1 to provide feedback.

Figure 3:
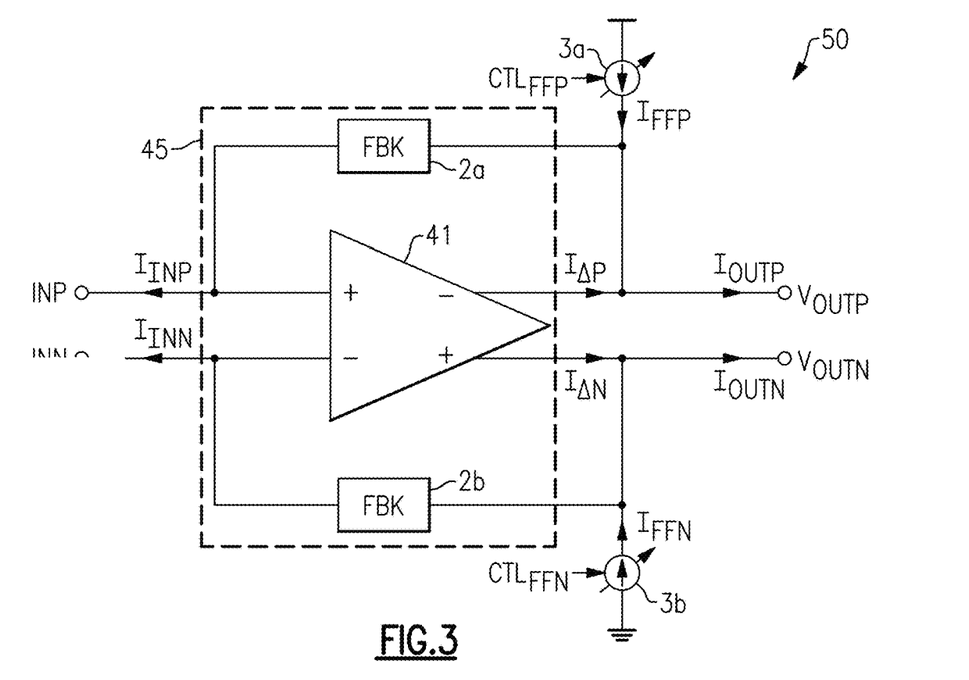
FIG. 3 is a schematic diagram of an amplifier system according to another embodiment.

FIG. 3 is a schematic diagram of an amplifier system 50 according to another embodiment. The amplifier system 50 includes a first feedforward current source 3a, a second feedforward current source 3b, and a transimpedance amplifier 45. The amplifier system 50 further includes a non-inverting current input terminal (INP), an inverting current input terminal (INN), a non-inverting voltage output terminal ($V_{OUTP}$), and an inverting voltage output terminal ($V_{OUTN}$).

The amplifier system 50 of FIG. 3 is similar to the amplifier system 10 of FIG. 1, except that the amplifier system 50 includes transimpedance amplifier circuitry implemented in a fully differential configuration.

For example, as shown in FIG. 3, the transimpedance amplifier 45 includes a differential input/differential output amplification circuit 41, a first feedback circuit 2a, and a second feedback circuit 2b. Additionally, the first feedback circuit 2a is electrically connected between an inverting output and a non-inverting input of the amplification circuit 41. Furthermore, the second feedback circuit 2b is electrically connected between a non-inverting output and an inverting input of the amplification circuit 41.

The transimpedance amplifier 45 operates as a differential current to differential voltage converter. For example, the transimpedance amplifier 45 controls a voltage difference between the non-inverting voltage output terminal ($V_{OUTP}$) and the inverting voltage output terminal ($V_{OUTN}$) based on amplifying a differential input current corresponding to a difference between a non-inverted input current ($I_{INP}$) received from the non-inverting current input terminal (INP) and an inverted input current ($I_{INN}$) received from the inverting current input terminal (INN).

As shown in FIG. 3, the first feedforward current source 3a is electrically connected to the inverting output of the transimpedance amplifier 45, and generates a non-inverted feedforward current ($I_{FFP}$). The non-inverted feedforward current ($I_{FFP}$) changes in relation to the non-inverted input current ($I_{INP}$). Additionally, the second feedforward current source 3b is electrically connected to the non-inverting output of the transimpedance amplifier 45, and generates an inverted feedforward current ($I_{FFN}$). The inverted feedforward current ($I_{FFN}$) changes in relation to the inverted input current ($I_{INN}$).

As shown in FIG. 3, a first control signal ($CTL_{FFP}$) controls the first feedforward current source 3a to output the non-inverted feedforward current ($I_{FFP}$) to track the non-inverted input current ($I_{INP}$). Additionally, a second control signal ($CTL_{FFN}$) controls the second feedforward current source 3b to output the inverted feedforward current ($I_{FFN}$) to track the inverted input current ($I_{INN}$). The first control signal and the second control signal can be generated in a wide variety of ways, including, but not limited to, using current mirrors, analog control loops, and/or digital processing to control the current sources.

Including the feedforward current sources can provide a number of advantages, including, but not limited to, higher gain, faster speed, and/or relaxed output drive characteristics. For example, to control the differential output voltage provided between the non-inverting voltage output terminal ($V_{OUTP}$) and the inverting voltage output terminal ($V_{OUTN}$), the amplifier system 50 can sink or source a non-inverted output current ($I_{OUTP}$) to the non-inverting voltage output terminal and an inverting output current ($I_{OUTN}$) to the inverting voltage output terminal, thereby adjusting the differential output voltage to a particular value. By including the first feedforward current source 3a and the second feedforward current source 3b, the amplification circuit 41 need only output small mismatch currents ($I_{AP}$, $I_{AN}$) from the amplification circuit's differential output. In certain implementations, $I_{AP}$ is about equal to $I_{INP}-I_{FFP}$, and $I_{AN}$ is about equal to $I_{INN}-I_{FFN}$.

Figure 4A:
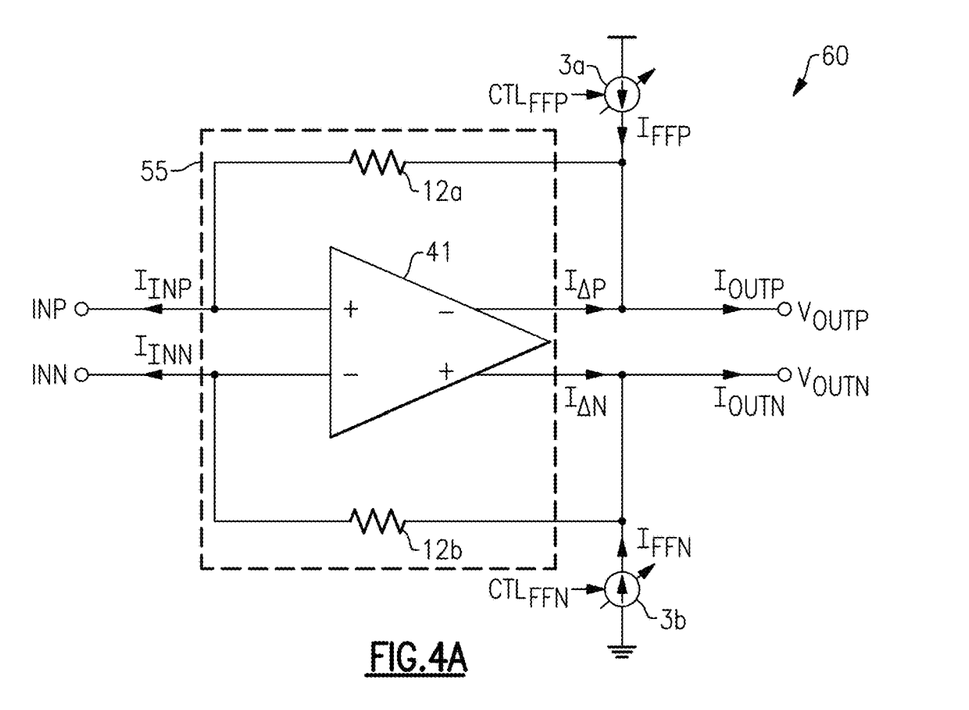
FIG. 4A is a schematic diagram of an amplifier system according to another embodiment.

FIG. 4A is a schematic diagram of an amplifier system 60 according to another embodiment. The amplifier system 60 includes a first feedforward current source 3a, a second feedforward current source 3b, and a transimpedance amplifier 55. The amplifier system 60 further includes a non-inverting current input terminal (INP), an inverting current input terminal (INN), a non-inverting voltage output terminal ($V_{OUTP}$), and an inverting voltage output terminal ($V_{OUTN}$).

The amplifier system 60 of FIG. 4A is similar to the amplifier system 50 of FIG. 3, except that the amplifier system 60 includes a specific implementation of feedback circuitry. For example, the transimpedance amplifier 55 of FIG. 4A includes a first feedback resistor 12a that is connected between the inverting output and the non-inverting input of the amplification circuit 41, and a second feedback resistor 12b that is connected between the non-inverting output and the inverting input of the amplification circuit 41.

Figure 4B:
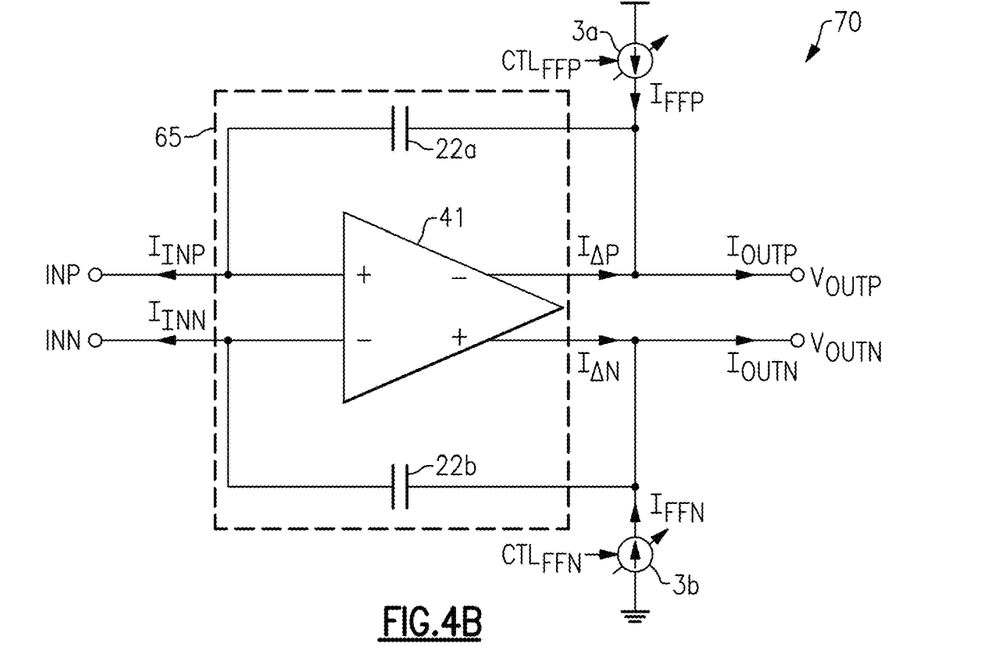
FIG. 4B is a schematic diagram of an amplifier system according to another embodiment.

FIG. 4B is a schematic diagram of an amplifier system 70 according to another embodiment. The amplifier system 70 includes a first feedforward current source 3a, a second feedforward current source 3b, and a transimpedance amplifier 65. The amplifier system 70 further includes a non-inverting current input terminal (INP), an inverting current input terminal (INN), a non-inverting voltage output terminal ($V_{OUTP}$), and an inverting voltage output terminal ($V_{OUTN}$).

The amplifier system 70 of FIG. 4B is similar to the amplifier system 50 of FIG. 3, except that the amplifier system 70 includes a specific implementation of feedback circuitry. For example, the transimpedance amplifier 65 of FIG. 4B includes a first feedback capacitor 22a that is connected between the inverting output and the non-inverting input of the amplification circuit 41, and a second feedback capacitor 22b that is connected between the non-inverting output and the inverting input of the amplification circuit 41.

Figure 4C:
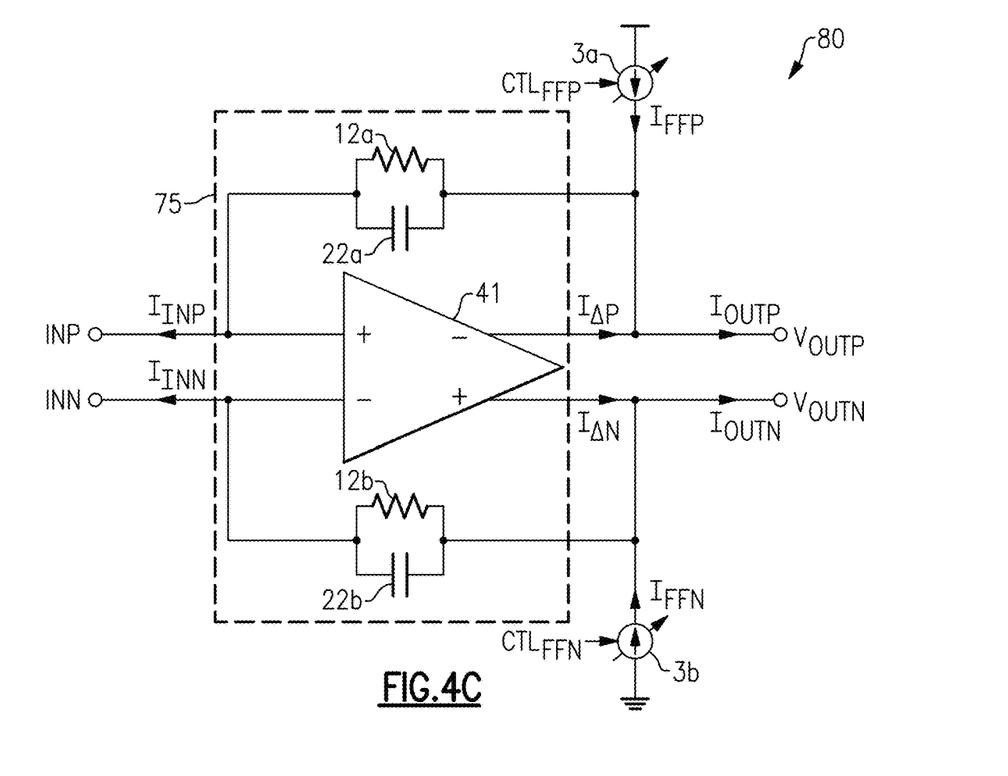
FIG. 4C is a schematic diagram of an amplifier system according to another embodiment.

FIG. 4C is a schematic diagram of an amplifier system 80 according to another embodiment. The amplifier system 80 includes a first feedforward current source 3a, a second feedforward current source 3b, and a transimpedance amplifier 75. The amplifier system 80 further includes a non-inverting current input terminal (INP), an inverting current input terminal (INN), a non-inverting voltage output terminal ($V_{OUTP}$), and an inverting voltage output terminal ($V_{OUTN}$).

The amplifier system 80 of FIG. 4C is similar to the amplifier system 50 of FIG. 3, except that the amplifier system 80 includes a specific implementation of feedback circuitry. For example, the transimpedance amplifier 75 of FIG. 4C includes a first feedback resistor 12a and a first feedback capacitor 22a that are connected in parallel between the inverting output and the non-inverting input of the amplification circuit 41. Additionally, the transimpedance amplifier 75 further includes a second feedback resistor 12b and a second feedback capacitor 22b that are connected in parallel between the non-inverting output and the inverting input of the amplification circuit 41.

Figure 5:
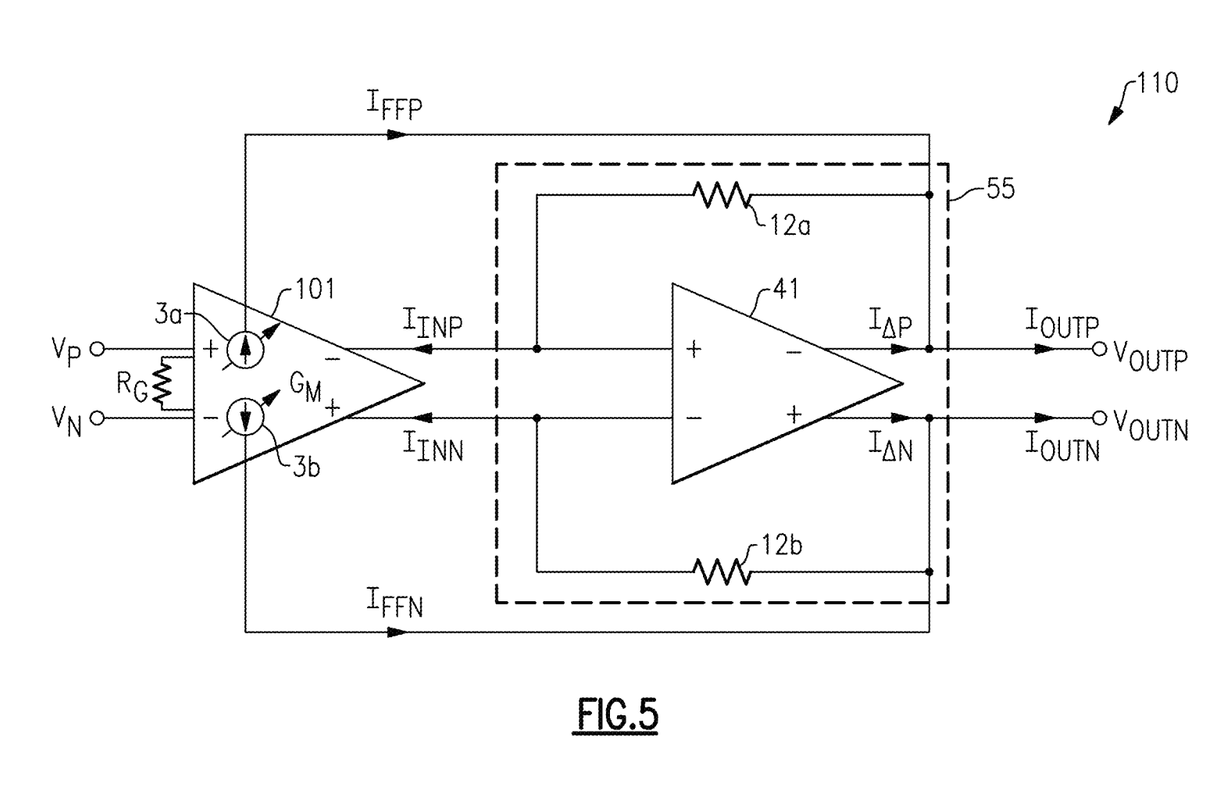
FIG. 5 is a schematic diagram of an amplifier system according to another embodiment.

FIG. 5 is a schematic diagram of an amplifier system 110 according to another embodiment. The amplifier system 110 includes a transconductance (GM) amplifier 101 and a transimpedance amplifier 55. The amplifier system 110 further includes a non-inverting voltage input terminal ($V_P$), an inverting voltage input terminal ($V_N$), a non-inverting voltage output terminal ($V_{OUTP}$), and an inverting voltage output terminal ($V_{OUTN}$).

As shown in FIG. 5, the transconductance amplifier 101 amplifies a voltage difference between the non-inverting voltage input terminal ($V_P$) and the inverting voltage input terminal ($V_N$) to generate a differential input current corresponding to a difference between the non-inverted input current ($I_{INP}$) and the inverted input current ($I_{INN}$). Additionally, the transimpedance amplifier 55 amplifies the differential input current to control a voltage difference between the non-inverting voltage output terminal ($V_{OUTP}$) and the inverting voltage output terminal ($V_{OUTN}$). The resistor $R_G$ shown in FIG. 5 sets a transconductance value of the transconductance amplifier 101.

In the illustrated embodiment, the transconductance amplifier 101 includes the first feedforward current source 3a for generating the non-inverted feedforward current ($I_{FFP}$), and the second feedforward current source 3b for generating the inverted feedforward current ($I_{FFN}$). Accordingly, feedforward current is provided from the transconductance amplifier 101 to the differential output of the transimpedance amplifier 55, in this embodiment. In certain implementations, the first feedforward current source 3a and the second feedforward current source 3b are implemented using current mirrors and/or a replica output driver circuit.

The amplifier system 110 of FIG. 5 illustrates one embodiment of an amplifier system in which feedforward current is generated by an input amplifier that drives a transimpedance amplifier.

Although the amplifier system 110 illustrates the transimpedance amplifier 55 as including resistive feedback, a transimpedance amplifier can operate using other types of feedback. For example, any of the transimpedance amplifiers of FIGS. 3 to 4C can be included in the amplifier system 110 to serve as a transimpedance amplifier. Furthermore, although a fully differential implementation is depicted, an input amplifier can provide a feedforward current to a transimpedance amplifier implemented in a single-ended configuration. For example, any of the transimpedance amplifiers of FIGS. 1 to 2C can be implemented to receive a feedforward current from an input amplifier.

Figure 6:
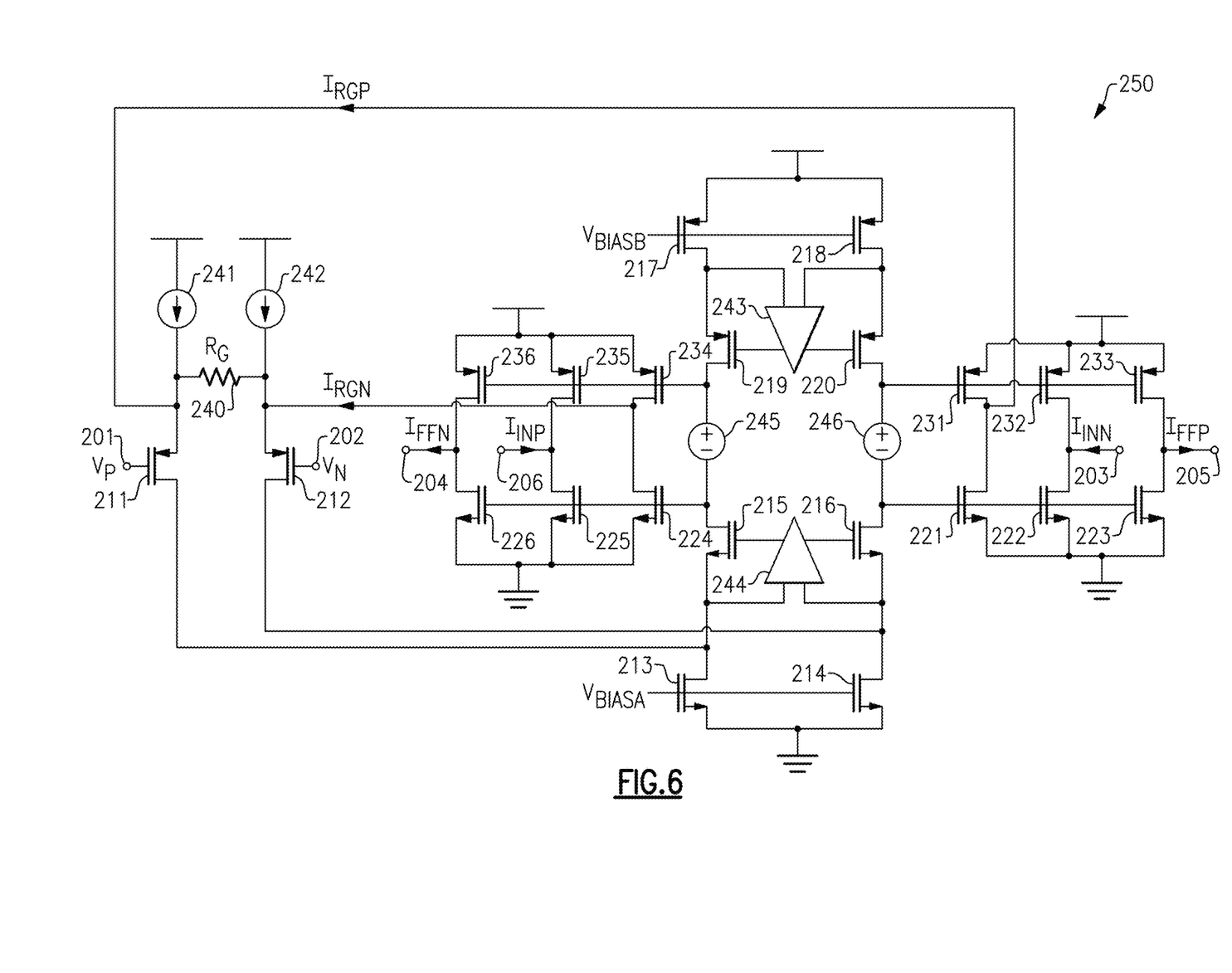
FIG. 6 is a schematic diagram of one embodiment of a transconductance amplifier that generates a feedforward current.

FIG. 6 is a schematic diagram of one embodiment of a transconductance amplifier 250 that generates a feedforward current. The transconductance amplifier 250 illustrates one embodiment of the transconductance amplifier 101 of FIG. 5. Although one embodiment of the transconductance amplifier 101 of FIG. 5 is depicted, other implementations are possible.

In the illustrated embodiment, the transconductance amplifier 250 includes a non-inverting voltage input 201 and an inverting voltage input 202 for coupling to the non-inverting voltage input terminal ($V_P$) and the inverting voltage input terminal ($V_N$), respectively, of FIG. 5. The transconductance amplifier 250 further includes a first current output 203 for outputting the inverted input current ($I_{INN}$), a second current output 204 for outputting the inverted feedforward current ($I_{FFN}$), a third current output 205 for outputting the non-inverted feedforward current ($I_{FFP}$), and a fourth current output 206 for outputting the non-inverting input current ($I_{INP}$).

With continuing reference to FIG. 6, the transconductance amplifier 250 further includes a first input p-type field effect transistor (PFET) 211, a second input PFET 212, a first current source n-type field effect transistor (NFET) 213, a second current source NFET 214, a first cascode NFET 215, a second cascode NFET 216, a first current source PFET 217, a second current source PFET 218, a first cascode PFET 219, a second cascode PFET 220, a first feedback NFET 221, a first output NFET 222, a first replica output NFET 223, a second feedback NFET 224, a second output NFET 225, a second replica output NFET 226, a first feedback PFET 231, a first output PFET 232, a first replica output PFET 233, a second feedback PFET 234, a second output PFET 235, a second replica output PFET 236, a resistor 240, a first current source 241, a second current source 242, a first feedback biasing amplifier 243, a second feedback biasing amplifier 244, a first DC voltage source 245, and a second DC voltage source 246.

In the illustrated embodiment, the transconductance amplifier 250 is implemented using PFET and NFET transistors, such as p-type metal oxide semiconductor (PMOS) and n-type metal oxide semiconductor (NMOS) transistors. However, other implementations are possible, such as those using bipolar transistors or a combination of bipolar transistors and FETs.

As shown in FIG. 6, the first output NFET 222 and the first output PFET 232 are used to generate the inverted input current ($I_{INN}$). Additionally, the first replica output NFET 223 and the first replica output PFET 233 are used to generate the non-inverted feedforward current ($I_{FFP}$) based on common gate voltages as used to control the first output NFET 222 and the first output PFET 232, respectively. Accordingly, the non-inverted feedforward current ($I_{FFP}$) tracks the inverted input current ($I_{INN}$).

The illustrated transconductance amplifier 250 includes feedback transistors used for generating feedback currents to the first input PFET 211 and the second input PFET 212. For example, the first feedback NFET 221 and the first feedback PFET 231 are used to generate a non-inverted feedback current ($I_{RGP}$) for the first input PFET 211, and the second feedback NFET 224 and the second feedback PFET 234 are used to generate an inverted feedback current ($I_{RGN}$) for the second input PFET 212.

With continuing reference to FIG. 6, the second output NFET 225 and the second output PFET 235 are used to generate the non-inverted input current ($I_{INP}$). Additionally, the second replica output NFET 226 and the second replica output PFET 236 are used to generate the inverted feedforward current ($I_{IFFN}$) based on the same gate voltages as used to control the second output NFET 225 and the second output PFET 235, respectively. Accordingly, the inverted feedforward current ($I_{IFFN}$) tracks the non-inverted input current ($I_{INP}$).

Thus, in this embodiment, the transconductance amplifier 250 includes replica or copy output driver circuitry used to generate a feedforward current. The replica driver circuitry can be implemented with unity scaling or with a desired non-unity scaling factor.

Figure 7:
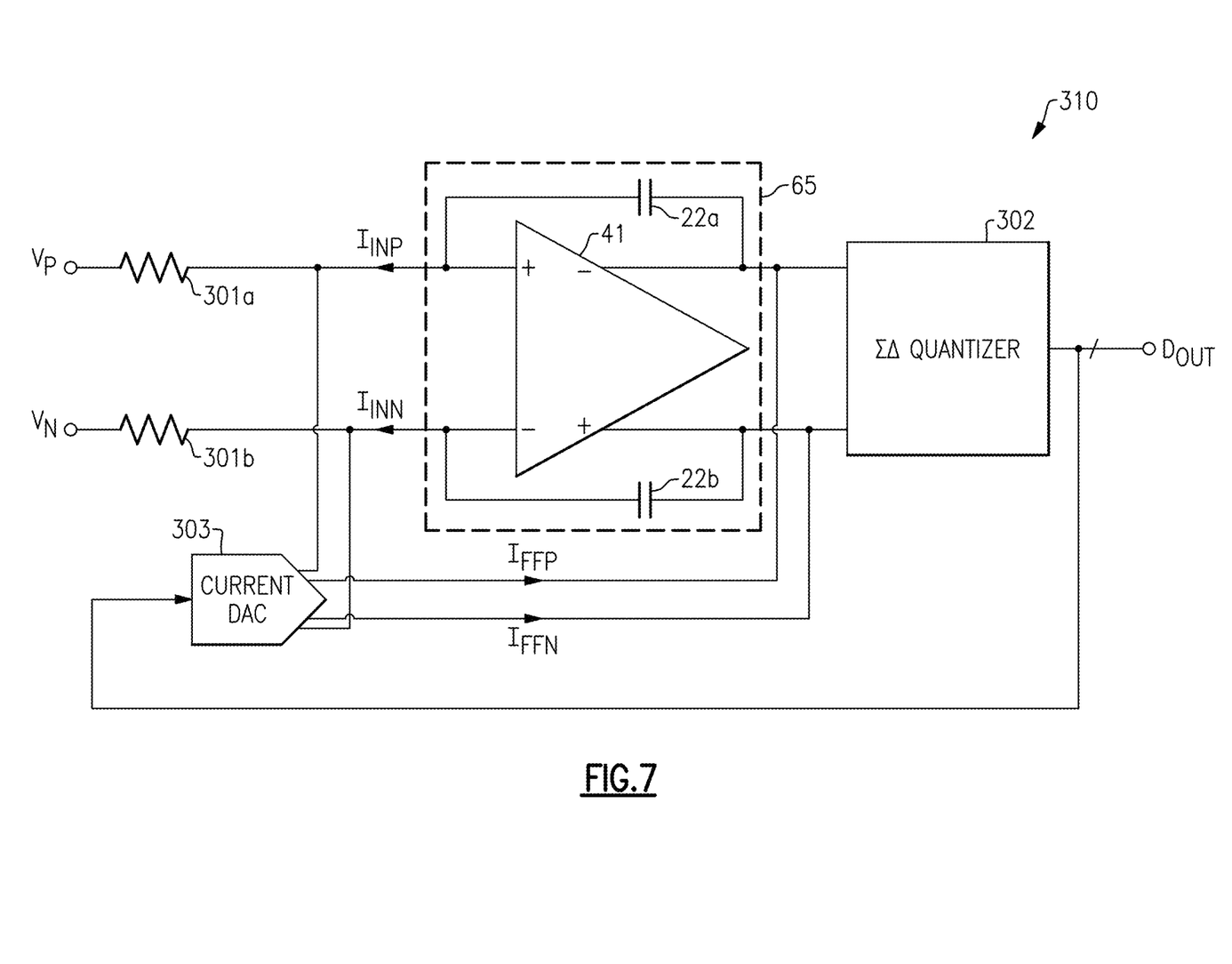
FIG. 7 is a schematic diagram of a sigma delta analog-to-digital converter system according to one embodiment.

FIG. 7 is a schematic diagram of a sigma delta (ΣΔ) analog-to-digital converter (ADC) system 310 according to one embodiment. The ΣΔ ADC system 310 includes a first input resistor 301a, a second input resistor 301b, a transimpedance amplifier 65, a ΣΔ quantizer 302, and a current digital-to-analog converter (DAC) 303.

As shown in FIG. 7, the transimpedance amplifier 65 includes an amplification circuit 41, a first feedback capacitor 22a, and a second feedback capacitor 22b. Thus, the ΣΔ ADC system 310 includes the transimpedance amplifier 65 described above with reference to FIG. 4B. However, the ΣΔ ADC system 310 can include other implementations of transimpedance amplifiers.

The first input resistor 301a is coupled between a non-inverting input voltage terminal ($V_P$) and a non-inverting current input of the transimpedance amplifier 65. Additionally, the second input resistor 301b is coupled between an inverting input voltage terminal ($V_N$) and an inverting current input of the transimpedance amplifier 65. The first input resistor 301a and the second input resistor 301b operate to convert a differential input voltage received between the non-inverting input voltage terminal and the inverting input voltage terminal to a differential signal current.

The ΣΔ quantizer 302 converts a differential output voltage of the transimpedance amplifier 65 to a digital output signal ($D_{OUT}$), which is provided using feedback to an input of the current DAC 303. The current DAC 303 generates a differential current that is provided to the differential current input of the transimpedance amplifier 65. The current DAC 303 also generates a differential feedforward current that is provided to the differential voltage output of the transimpedance amplifier 65.

The feedback provided from the ΣΔ quantizer 302 operates to control the digital output signal to have a digital value corresponding to the analog differential input voltage of the ΣΔ ADC system 310. For example, the feedback results in the digital output signal being substantially equal to the analog input voltage when the transimpedance amplifier 65 operates with high gain. Thus, the current DAC 303 injects an input current to the transimpedance amplifier 65 corresponding to the analog input voltage. The current DAC 303 further provides a feedforward current to the output of the transimpedance amplifier 65 in accordance with the teachings herein.

In certain implementations, one or more additional gain stages is included between the output of the transimpedance amplifier 65 and the input of the ΣΔ quantizer 302 to enhance gain.

Figure 8:
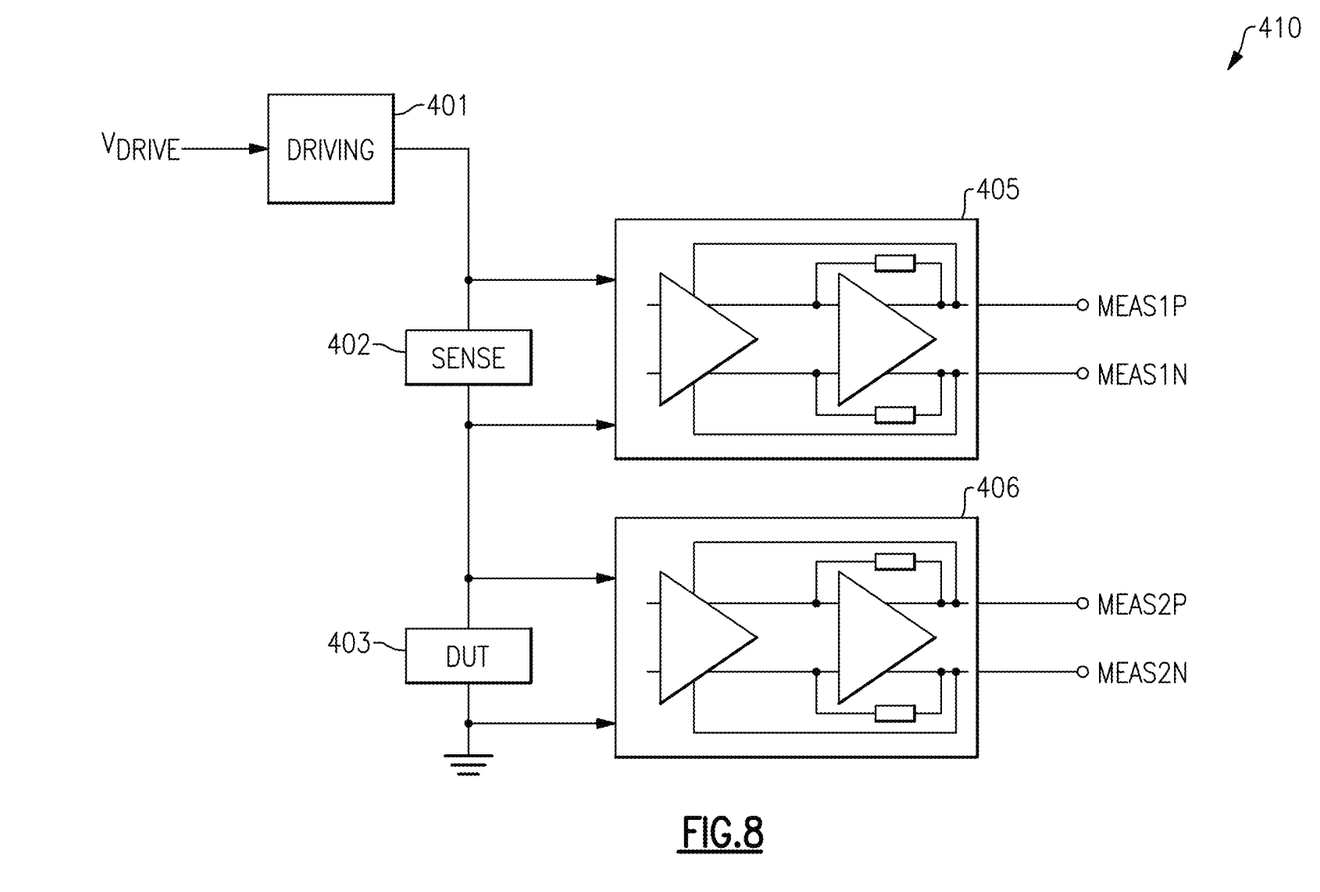
FIG. 8 is a schematic diagram of an impedance measurement system according to one embodiment.

FIG. 8 is a schematic diagram of an impedance measurement system 410 according to one embodiment. The impedance measurement system 410 includes a driving circuit 401, a sensing circuit 402, a device under test (DUT) 403, a first instrumentation amplifier 405, and a second instrumentation amplifier 406.

As shown in FIG. 8, the instrumentation amplifiers are each implemented with a transconductance amplifier that provides a feedforward current to a transimpedance amplifier in accordance with the teachings herein. For example, each of the instrumentation amplifiers can be implemented in accordance with the embodiment of FIG. 5.

Although FIG. 8 illustrates another example of an application that benefits from using a transimpedance amplifier operating with feedforward current, the teachings herein are applicable to a wide variety of applications.

As shown in FIG. 8, the driving circuit 401 operates to drive the DUT 403 through the sensing circuit 402. Additionally, the driving circuit 401 is controlled by a driving voltage ($V_{DRIVE}$), which can be used control a voltage across the DUT 403 and/or a current through the DUT 403. The driving circuit 401 can be implemented in a wide variety of ways. In one example, the driving circuit 401 includes an amplifier connected with feedback, such as a unity-gain buffer that drives the DUT 403 to control biasing.

As shown in FIG. 8, the impedance measurement system 410 includes the first instrumentation amplifier 405 for generating a first differential measurement signal between a first non-inverting measurement terminal (MEAS1P) and a first inverting measurement terminal (MEAS1N), and the second instrumentation amplifier 406 for generating a second differential measurement signal between a second non-inverting measurement terminal (MEAS2P) and a second inverting measurement terminal (MEAS2N).

The first instrumentation amplifier 405 amplifies the voltage across the DUT 403, and thus the first differential measurement signal indicates an amount of current through the DUT 403. For example, as the current through the DUT 403 changes, the voltage across the sensing circuit 402 changes correspondingly. The second instrumentation amplifier 406 amplifies a voltage across the DUT 403, and thus the second differential measurement signal indicates a bias voltage of the DUT 403.

Accordingly, the first differential measurement signal and the second differential measurement can be processed to determine the current through the DUT 403 and/or the bias voltage across the DUT 403. The measurements can be used in determining an impedance of the DUT 403, which in certain implementations corresponds to a sensor. The measurements can also be processed and used to provide feedback. For instance, in one example, the second instrumentation amplifier 406 controls the driving voltage ($V_{DRIVE}$) through a feedback loop to enhance an accuracy of biasing and/or protect the DUT 403 from overvoltage and/or other undesired biasing conditions.

By implementing the first instrumentation amplifier 405 and/or the second instrumentation amplifier 406 in accordance with the teachings herein, enhanced performance of the impedance measurement system 410 can be achieved. For example, the first instrumentation amplifier 405 and/or the second instrumentation amplifier 406 can generate the measurement signals with higher gain, which can result in superior measurement precision. Additionally or alternatively, the first instrumentation amplifier 405 and/or the second instrumentation amplifier 406 can operate with higher speed, which leads to enhanced accuracy in measurements and/or superior protection to the DUT 403 when a measurement signal is used to control the driving voltage ($V_{DRIVE}$) using feedback.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. An amplifier system with feedforward current, the amplifier system comprising:
    a current input terminal;
    a voltage output terminal;
    a transimpedance amplifier configured to generate an output voltage at the voltage output terminal based on amplifying an input current received from the current input terminal; and
    a controllable current source electrically connected to the voltage output terminal, wherein the controllable current source is operable to output a feedforward current that has an amplitude that mirrors an amplitude of the input current.

2. The amplifier system of claim 1, wherein the feedforward current is substantially equal to the input current.

3. The amplifier system of claim 1, wherein the feedforward current is scaled with respect to the input current by a scaling factor, wherein the scaling factor has a value between about 0.5 and about 1.

4. The amplifier system of claim 1, further comprising an input amplifier configured to provide the input current to the transimpedance amplifier, wherein the input amplifier comprises the controllable current source.

5. The amplifier system of claim 4, wherein the input amplifier is a transconductance amplifier.

6. The amplifier system of claim 5, further comprising a sensing circuit, and a driver circuit configured to drive the sensing circuit, wherein the input amplifier generates the input current based on amplifying a voltage across the sensing circuit.

7. The amplifier system of claim 5 implemented in an impedance measurement system, wherein the input amplifier generates the input current based on amplifying a voltage across a device under test (DUT) being measured by the impedance measurement system.

8. The amplifier system of claim 4, wherein an output stage of the input amplifier comprises a first transistor configured to generate the input current and a second transistor configured to generate the feedforward current, wherein the first transistor and the second transistor are controlled by a common voltage.

9. The amplifier system of claim 1, further comprising a sigma delta quantizer configured to convert the output voltage to a digital output signal, wherein the controllable current source comprises a current digital-to-analog converter (DAC) configured to generate the feedforward current based on the digital output signal.

10. The amplifier system of claim 1, wherein the transimpedance amplifier comprises an amplification circuit, and a feedback circuit electrically connected between a single-ended output of the amplification circuit and an inverting input of the amplification circuit, wherein the feedback circuit comprises at least one of a resistor or a capacitor.

11. The amplifier system of claim 1, wherein the voltage output terminal and the controllable current source are implemented differentially.

12. The amplifier system of claim 1, wherein the transimpedance amplifier comprises an amplification circuit, a first feedback circuit electrically connected between an inverting output of the amplification circuit and a non-inverting input of the amplification circuit, and a second feedback circuit electrically connected between a non-inverting output and an inverting input of the amplification circuit.

13. The amplifier system of claim 12, wherein the first feedback circuit comprises at least one of a first resistor or a first capacitor, and wherein the second feedback circuit comprises at least one of a second resistor or a second capacitor.

14. A method of electronic amplification, the method comprising:
    receiving an input current at a current input of a transimpedance amplifier;
    amplifying the input current to generate an output voltage using the transimpedance amplifier;
    providing the output voltage at a voltage output of the transimpedance amplifier; and
    providing a feedforward current to the voltage output of the transimpedance amplifier, the feedforward current having an amplitude that mirrors an amplitude of the input current.

15. The method of claim 14, wherein providing the feedforward current includes controlling the feedforward current to be substantially equal to the input current.

16. The method of claim 14, wherein providing the feedforward current includes scaling the feedforward current with respect to the input current by a scaling factor, wherein the scaling factor has a value between about 0.5 and about 1.

17. The method of claim 14, further comprising providing the input current to the transimpedance amplifier from an input amplifier, and generating the feedforward current using the input amplifier.

18. The method of claim 17, further comprising generating the input current based on at least one of amplifying a sensing voltage across a sensing circuit or amplifying a bias voltage across a device under test.

19. The method of claim 14, further comprising converting the output voltage to a digital output signal, and controlling the feedforward current based on the digital output signal.

20. An amplifier system comprising:
- a current input terminal configured to receive an input current;
- a voltage output terminal configured to provide an output voltage;
- a transimpedance amplifier including a current input configured to receive the input current and a voltage output configured to provide the output voltage; and
- means for injecting a feedforward current at the voltage output of the transimpedance amplifier, the feedforward current having an amplitude that mirrors an amplitude of the input current.

* * * * *